US009324590B2

(12) United States Patent
Gurary et al.

(10) Patent No.: US 9,324,590 B2
(45) Date of Patent: Apr. 26, 2016

(54) PROCESSING METHODS AND APPARATUS WITH TEMPERATURE DISTRIBUTION CONTROL

(75) Inventors: Alex Gurary, Bridgewater, NJ (US); Mikhail Belousov, Plainsboro, NJ (US); Vadim Boguslavskiy, Princeton, NJ (US); Bojan Mitrovic, Somerset, NJ (US)

(73) Assignee: Veeco Instruments Inc., Plainview, NY (US)

( * ) Notice: Subject to any disclaimer, the term of this patent is extended or adjusted under 35 U.S.C. 154(b) by 991 days.

(21) Appl. No.: 12/967,381

(22) Filed: Dec. 14, 2010

(65) Prior Publication Data

US 2011/0206843 A1 Aug. 25, 2011

Related U.S. Application Data

(60) Provisional application No. 61/307,497, filed on Feb. 24, 2010.

(51) Int. Cl.
*C23C 16/00* (2006.01)
*C23F 1/00* (2006.01)
*H01L 21/306* (2006.01)
(Continued)

(52) U.S. Cl.
CPC ...... *H01L 21/67109* (2013.01); *C23C 16/4584* (2013.01); *C23C 16/45521* (2013.01); *C23C 16/52* (2013.01); *H01L 21/68785* (2013.01); *H01L 21/68792* (2013.01)

(58) Field of Classification Search
CPC ........ C30B 25/12; C30B 25/14; C30B 25/02; C30B 31/14; C30B 25/08; C30B 25/10; C30B 23/02; C30B 29/06; C30B 33/00; C30B 25/165; C30B 29/403; C30B 31/12; C30B 25/105; C30B 29/36; C30B 35/00; C30B 29/406; H01L 21/67109; H01L 21/68771; H01L 21/67248; C23C 16/4581; C23C 16/46; C23C 16/4582; C23C 16/4583; C23C 16/4584; C23C 16/4585; C23C 16/4586; C23C 16/04; C23C 16/52
USPC ......... 118/725, 728–730; 156/345.51–345.55
See application file for complete search history.

(56) References Cited

U.S. PATENT DOCUMENTS

| 4,512,841 A | 4/1985 | Cunningham, Jr. et al. |
| 4,869,801 A | 9/1989 | Helms et al. |

(Continued)

FOREIGN PATENT DOCUMENTS

| CN | 101426954 A | 5/2005 |
| DE | 102005018161 A1 | 11/2006 |

(Continued)

OTHER PUBLICATIONS

Vollf et al., U.S. Appl. No. 61/190,494, filed Aug. 29, 2008.

(Continued)

*Primary Examiner* — Rakesh Dhingra
(74) *Attorney, Agent, or Firm* — Lerner, David, Littenberg, Krumholz & Mentlik, LLP

(57) ABSTRACT

Wafer treatment process and apparatus is provided with a wafer carrier arranged to hold wafers and to inject a fill gas into gaps between the wafers and the wafer carrier. The apparatus is arranged to vary the composition, flow rate, or both of the fill gas so as to counteract undesired patterns of temperature non-uniformity of the wafers.

16 Claims, 3 Drawing Sheets

(51) Int. Cl.
*H01L 21/67* (2006.01)
*C23C 16/455* (2006.01)
*C23C 16/458* (2006.01)
*C23C 16/52* (2006.01)
*H01L 21/687* (2006.01)

(56) References Cited

U.S. PATENT DOCUMENTS

| | | | |
|---|---|---|---|
| 5,318,801 A | 6/1994 | Snail et al. | |
| 5,474,612 A | 12/1995 | Sato et al. | |
| 5,679,405 A * | 10/1997 | Thomas et al. | 427/248.1 |
| 5,782,979 A * | 7/1998 | Kaneno et al. | 118/500 |
| 5,906,684 A * | 5/1999 | Tamura et al. | 118/728 |
| 6,001,183 A | 12/1999 | Gurary et al. | |
| 6,184,154 B1 | 2/2001 | Dietze et al. | |
| 6,506,252 B2 * | 1/2003 | Boguslavskiy et al. | 117/200 |
| 6,685,774 B2 | 2/2004 | Boguslavskiy et al. | |
| 7,276,124 B2 | 10/2007 | Gurary et al. | |
| 2002/0106826 A1 | 8/2002 | Boguslavskiy et al. | |
| 2003/0233768 A1 | 12/2003 | Kaeppeler | |
| 2004/0123805 A1 | 7/2004 | Tomoyoshi | |
| 2004/0255843 A1 | 12/2004 | Yoshida et al. | |
| 2005/0183829 A1* | 8/2005 | Goodman et al. | 156/345.51 |
| 2005/0207088 A1 | 9/2005 | Nishimoto et al. | |
| 2007/0081296 A1 | 4/2007 | Brillhart et al. | |
| 2007/0131173 A1* | 6/2007 | Halpin et al. | 118/728 |
| 2007/0186853 A1 | 8/2007 | Gurary et al. | |
| 2008/0032040 A1* | 2/2008 | Okabe et al. | 427/96.8 |
| 2009/0110805 A1 | 4/2009 | Kaeppeler et al. | |
| 2009/0155028 A1 | 6/2009 | Boguslavskiy et al. | |
| 2010/0055318 A1 | 3/2010 | Volf et al. | |

FOREIGN PATENT DOCUMENTS

| | | |
|---|---|---|
| JP | H02030695 | 2/1990 |
| JP | H04024916 | 1/1992 |
| JP | H05013350 | 1/1993 |
| JP | H06021005 | 1/1994 |
| JP | H06283431 A | 10/1994 |
| JP | 2000-003879 A | 1/2000 |
| JP | 2007-109770 A | 4/2007 |
| JP | 2008-252106 A | 10/2008 |
| JP | 2009088088 A | 4/2009 |
| JP | 2009534824 A | 9/2009 |
| WO | 9709737 A1 | 3/1997 |
| WO | 9832893 A2 | 7/1998 |
| WO | 02063074 A1 | 8/2002 |
| WO | 2007122147 A1 | 11/2007 |

OTHER PUBLICATIONS

Volf et al., U.S. Appl. No. 12/549,768, filed Aug. 28, 2009.
International Search Report and Written Opinion, PCT/US2010/060258, dated Apr. 28, 2011.
Taiwan Office Action for Application No. 100106284 dated Dec. 13, 2013.
Singapore Written Opinion for Application No. 201206198-2 dated Jan. 23, 2014.
Japanese Office Action for Application No. JP2012-554991 dated Jan. 6, 2015.
International Preliminary Report on Patentability for International Application No. PCT/US2010/060258, filed Dec. 12, 2010.
US Office Action for U.S. Appl. No. 13/827,495 dated Dec. 17, 2014.
Chinese Office Action for Application No. 201080066401.7 dated Apr. 22, 2015.
U.S. Office Action for U.S. Appl. No. 13/827,495 dated Mar. 14, 2013.

* cited by examiner

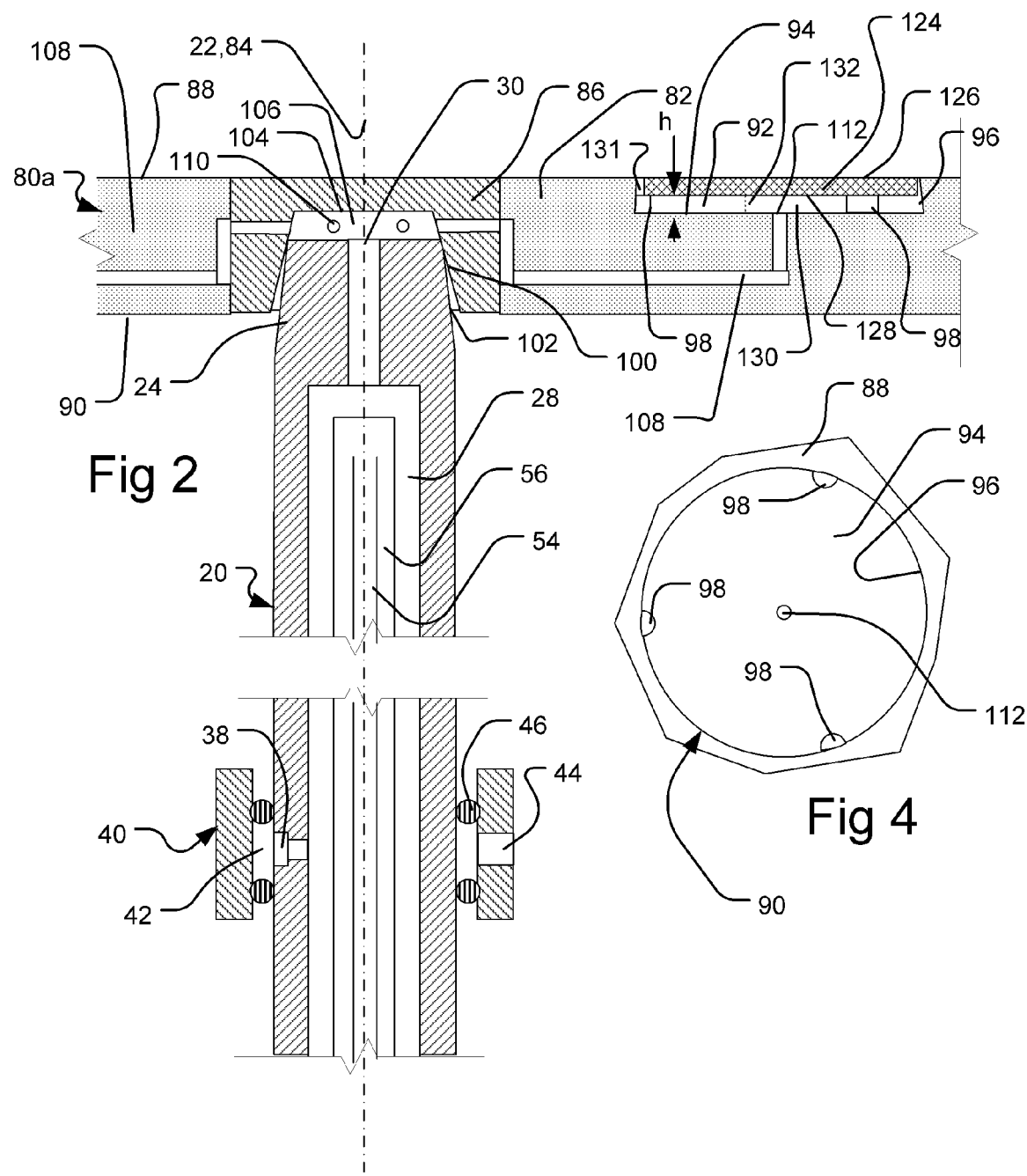

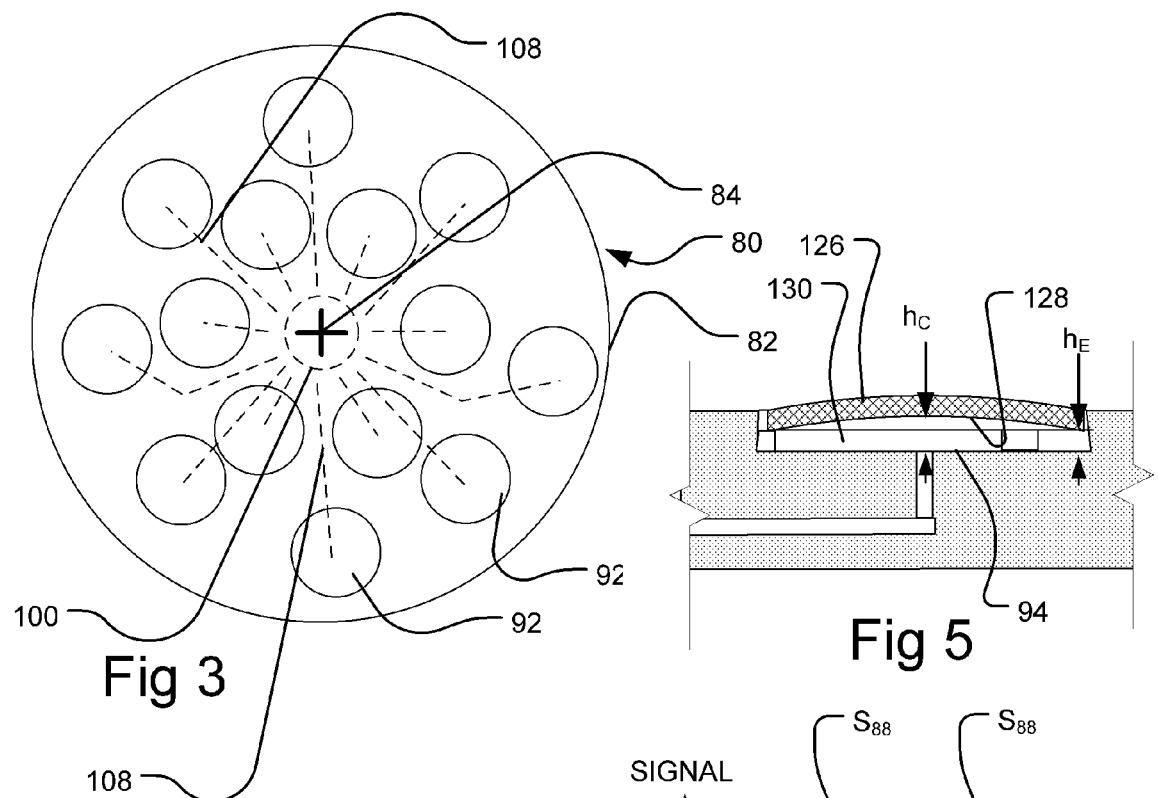
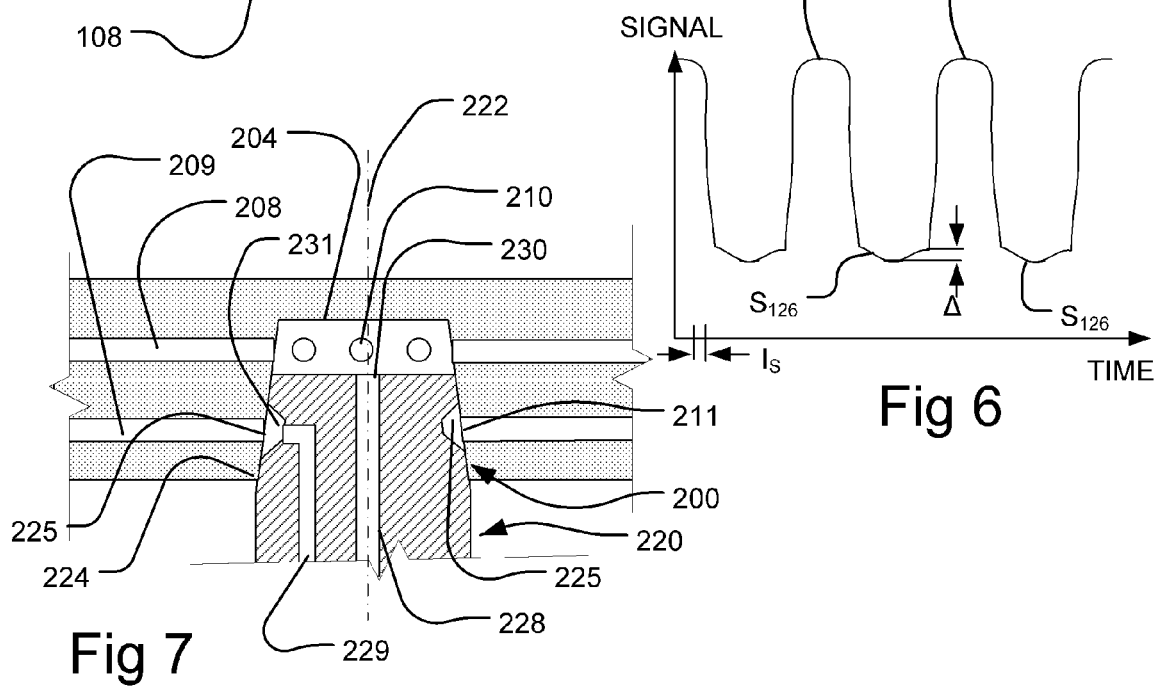

PROCESSING METHODS AND APPARATUS WITH TEMPERATURE DISTRIBUTION CONTROL

CROSS-REFERENCE TO RELATED APPLICATIONS

This application claims the benefit of the filing date of U.S. Provisional Patent Application No. 61/307,497 filed Feb. 24, 2010, the disclosure of which is hereby incorporated herein by reference.

BACKGROUND OF THE INVENTION

The present invention relates to wafer processing apparatus, to wafer carriers for use in such processing apparatus, and to methods of wafer processing.

Many semiconductor devices are formed by processes performed on a substrate. The substrate typically is slab of a crystalline material, commonly referred to as a "wafer." Typically, the wafer is formed from a crystalline material, and is in the form of a disc. One common process is epitaxial growth. For example, devices formed from compound semiconductors such as III-V semiconductors typically are formed by growing successive layers of the compound semiconductor using metal organic chemical vapor deposition or "MOCVD." In this process, the wafers are exposed to a combination of gases, typically including a metal organic compound as a source of a group III metal, and also including a source of a group V element which flow over the surface of the wafer while the wafer is maintained at an elevated temperature. Typically, the metal organic compound and group V source are combined with a carrier gas which does not participate appreciably in the reaction as, for example, nitrogen. One example of a III-V semiconductor is gallium nitride, which can be formed by reaction of an organo gallium compound and ammonia on a substrate having a suitable crystal lattice spacing, as for example, a sapphire wafer. Typically, the wafer is maintained at a temperature on the order of 1000-1100° C. during deposition of gallium nitride and related compounds.

Composite devices can be fabricated by depositing numerous layers in succession on the surface of the wafer under slightly different reaction conditions, as for example, additions of other group III or group V elements to vary the crystal structure and bandgap of the semiconductor. For example, in a gallium nitride based semiconductor, indium, aluminum or both can be used in varying proportion to vary the bandgap of the semiconductor. Also, p-type or n-type dopants can be added to control the conductivity of each layer. After all of the semiconductor layers have been formed and, typically, after appropriate electric contacts have been applied, the wafer is cut into individual devices. Devices such as light-emitting diodes ("LEDs"), lasers, and other optoelectronic devices can be fabricated in this way.

In a typical chemical vapor deposition process, numerous wafers are held on a device commonly referred to as a wafer carrier so that a top surface of each wafer is exposed at the top surface of the wafer carrier. The wafer carrier is then placed into a reaction chamber and maintained at the desired temperature while the gas mixture flows over the surface of the wafer carrier. It is important to maintain uniform conditions at all points on the top surfaces of the various wafers on the carrier during the process. Minor variations in composition of the reactive gases and in the temperature of the wafer surfaces cause undesired variations in the properties of the resulting semiconductor device. For example, if a gallium and indium nitride layer is deposited, variations in wafer surface temperature will cause variations in the composition and bandgap of the deposited layer. Because indium has a relatively high vapor pressure, the deposited layer will have a lower proportion of indium and a greater bandgap in those regions of the wafer where the surface temperature is higher. If the deposited layer is an active, light-emitting layer of an LED structure, the emission wavelength of the LEDs formed from the wafer will also vary. Thus, considerable effort has been devoted in the art heretofore towards maintaining uniform conditions.

One type of CVD apparatus which has been widely accepted in the industry uses a wafer carrier in the form of a large disc with numerous wafer-holding regions, each adapted to hold one wafer. The wafer carrier is supported on a spindle within the reaction chamber so that the top surface of the wafer carrier having the exposed surfaces of the wafers faces upwardly toward a gas distribution element. While the spindle is rotated, the gas is directed downwardly onto the top surface of the wafer carrier and flows across the top surface toward the periphery of the wafer carrier. The used gas is evacuated from the reaction chamber through ports disposed below the wafer carrier. The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution element typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers.

Although considerable effort has been devoted in the art heretofore to design an optimization of such systems, still further improvement would be desirable. In particular, it would be desirable to provide better uniformity of temperature across the surface of each wafer.

SUMMARY OF THE INVENTION

One aspect of the invention provides methods of processing wafers. A method desirably includes the step of holding one or more wafers on a carrier so that a bottom surface of each wafer directly confronts a surface of the carrier with a gap defined between the confronting surfaces and so that a top surface of each wafer is exposed. The method preferably further includes the steps of heating the wafers at least in part by heat transfer from the carrier across the gaps and, during the heating step, applying a process gas to the exposed top surfaces of the wafers. Most preferably, the method further includes the step of varying a thermal conductivity of a fill gas disposed in the gaps during the applying step. For example, the fill gas may be supplied to the gaps during the applying step and the flow rate of the supplied fill gas, the composition of the fill gas, or both, may be varied with time during the applying step. As further discussed below, the variation in the thermal conductivity of the fill gas can minimize variations in the surface temperatures of the wafers. The step of varying the conductivity of the fill gas can be performed in response to monitoring of the temperature distribution of the wafers.

In certain embodiments, the process gas tends to enter gaps between the wafers and the carrier at the periphery of the wafers. The fill gas may be supplied so as to maintain a gradient in the concentration of the fill gas in the gap beneath each wafer as, for example, a relatively high concentration of process gas and low concentration of fill gas near the periphery of the wafer and a higher concentration of fill gas near the center of the wafer. This can provide graded thermal conductivity to counteract other effects which tend to cause variation in the surface temperature across each wafer.

A further aspect of the invention provides a wafer carrier. The wafer carrier according to this aspect of the invention desirably has a body defining a central axis and a top surface transverse to the central axis. The body desirably has wafer-holding features adapted to hold a plurality of wafers so that top surfaces of the wafers are exposed and so that there is a gap between a bottom surface of each wafer and a surface of the body. The wafer carrier desirably has structure defining one or more gas conduits extending to the wafer-holding features of the body so that a fill gas supplied to the gas conduits will be directed into the gaps between the bottom surface of the wafers and the body. The carrier most preferably also includes a fitting at the central axis of the body, the fitting being adapted to releasably engage a spindle of a wafer processing apparatus and hold the wafer carrier on the spindle so that the one or more gas conduits are in communication with one or more gas passageways of the spindle. For example, the fitting may define a recess open in the downward direction for receiving the spindle and the one or more gas conduits may communicate with the recess. The wafer-holding features may include a plurality of pockets in the top surface of the body, and the passageways may communicate with the pockets.

Yet another aspect of the invention provides wafer processing apparatus. The wafer processing apparatus according to this aspect of the invention desirably includes a processing chamber and a spindle mounted within the chamber for rotation about an axis extending in upward and downward directions. The spindle desirably has a gas passageway having an opening adjacent the upper end of the spindle. The upper end of the spindle is adapted to releasably engage a wafer carrier so that the wafer carrier is mechanically connected to the spindle and so that a gas conduit of the wafer carrier is in communication with the opening of the gas passageway. For example, the spindle may have a fitting complementary to the fitting of a wafer carrier as discussed above. The apparatus desirably includes a rotary connection having an inlet communicating with the gas passageway of the spindle.

BRIEF DESCRIPTION OF THE DRAWINGS

FIG. 2 is a fragmentary, diagrammatic sectional view depicting elements of the apparatus of FIGS. 1-3 in conjunction with a wafer.

FIG. 3 is a diagrammatic top plan view of an element used in the apparatus of FIG. 1.

FIG. 4 is a fragmentary diagrammatic top plan view depicting a portion of the elements of FIG. 2.

FIG. 5 is a view similar to FIG. 4 depicting the elements of the apparatus and the wafer shown in FIG. 2 during a different operating condition.

FIG. 6 is a graph depicting certain signals used in the apparatus of FIGS. 1-5.

FIG. 7 is a fragmentary, diagrammatic sectional view depicting components of apparatus according to a further embodiment of the invention.

DETAILED DESCRIPTION

Figure 1:
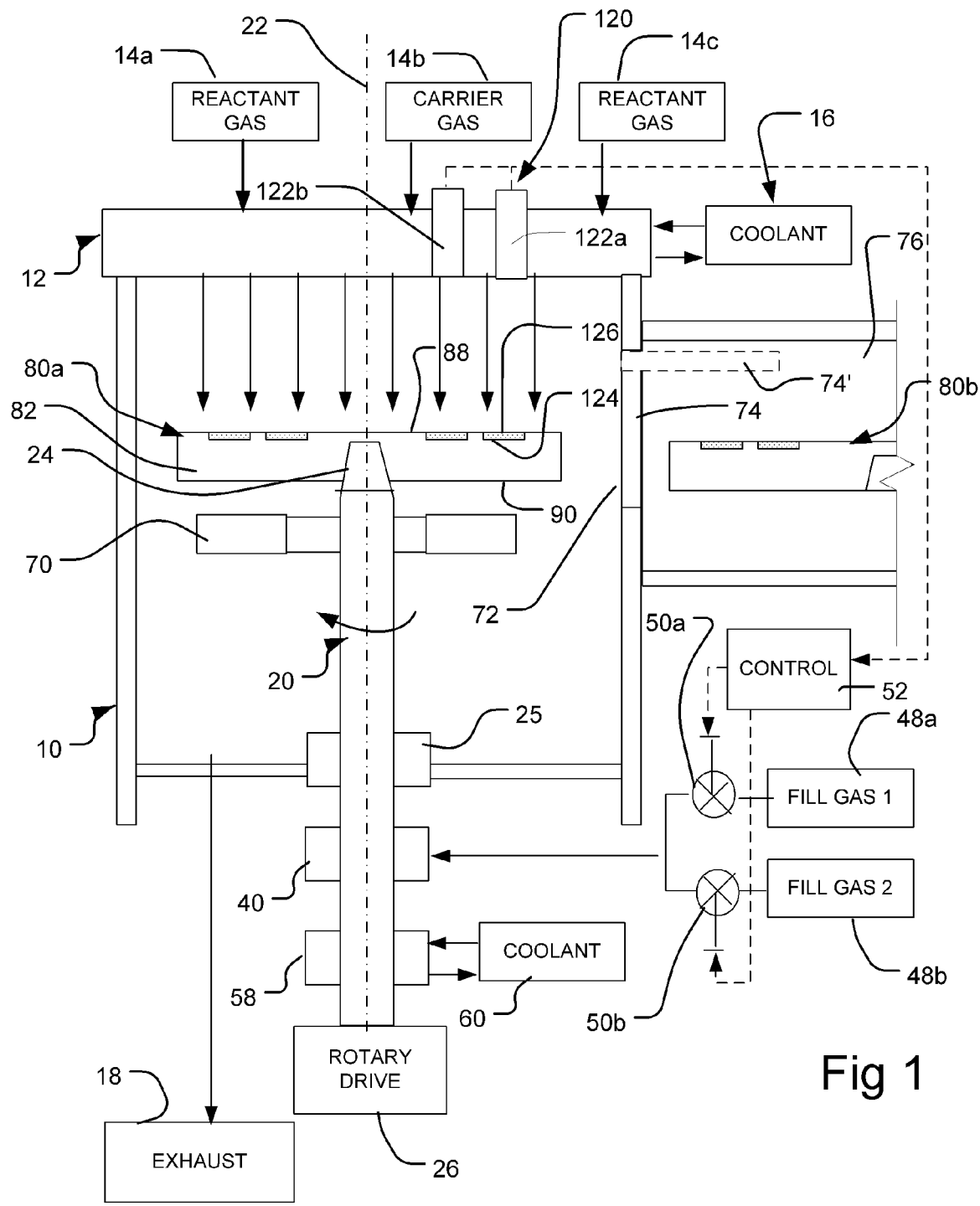
FIG. 1 is a simplified, schematic sectional view depicting chemical vapor deposition apparatus in accordance with one embodiment of the invention.

Chemical vapor deposition apparatus in accordance with one embodiment of the invention includes a reaction chamber 10 having a gas distribution element 12 arranged at one end of the chamber. The end having the gas distribution element 12 is referred to herein as the "top" end of the chamber 10. This end of the chamber typically, but not necessarily, is disposed at the top of the chamber in the normal gravitational frame of reference. Thus, the downward direction as used herein refers to the direction away from the gas distribution element 12; whereas the upward direction refers to the direction within the chamber, toward the gas distribution element 12, regardless of whether these directions are aligned with the gravitational upward and downward directions. Similarly, the "top" and "bottom" surfaces of elements are described herein with reference to the frame of reference of chamber 10 and element 12.

Gas distribution element 12 is connected to sources 14a, 14b, 14c for supplying process gases to be used in the wafer treatment process, such as a carrier gas and reactant gases such as a metalorganic compound and a source of a group V metal. The gas distribution element is arranged to receive the various gases and direct a flow of process gasses generally in the downward direction. The gas distribution element 12 desirably is also connected to a coolant system 16 arranged to circulate a liquid through the gas distribution element so as to maintain the temperature of the element at a desired temperature during operation. A similar coolant arrangement (not shown) can be provided for cooling the walls of chamber 10. Chamber 10 is also equipped with an exhaust system 18 arranged to remove spent gases from the interior of the chamber through ports (not shown) at or near the bottom of the chamber so as to permit continuous flow of gas in the downward direction from the gas distribution element.

A spindle 20 is arranged within the chamber so that the central axis 22 of the spindle extends in the upward and downward directions. The spindle is mounted to the chamber by a conventional rotary pass-through device 25 incorporating bearings and seals (not shown) so that the spindle can rotate about axis 22, while maintaining a seal between the spindle and the wall of chamber 10. The spindle has a fitting 24 at its top end, i.e., at the end of the spindle closest to the gas distribution element 12. As further discussed below, fitting 24 is adapted to releasably engage a wafer carrier. In the particular embodiment depicted, the fitting 24 is a generally frusto-conical element tapering toward the top end of the spindle and terminating at a flat top surface. A frustoconical element is an element having the shape of a frustum of a cone. Spindle 20 is connected to a rotary drive mechanism 26 such as an electric motor drive, which is arranged to rotate the spindle about axis 22. As best seen in FIG. 2 spindle 22 has an internal gas passageway 28 terminating at an opening 30 in fitting 24, adjacent the upper end of the spindle.

The spindle has a gas entry port 38 communicating with gas passageway 28 remote from the upper end of the spindle, below chamber 10 and pass-through 25. A rotary connection assembly 40 defines a space 42 surrounding port 38, so that port 38 remains in communication with space 42 during rotation of the spindle. The rotary connection has an inlet 44 communicating with space 42 and hence with port 38 and gas passageway 28 of the spindle. The rotary connection also includes conventional seals 46 which isolate space 42 from the external environment. Although these seals are diagrammatically depicted as simple O-rings for simplicity of illustration, the seals may be of any conventional type.

The inlet 44 of rotary connection 40 is connected to fill gas supply sources 48a and 48b (FIG. 1). These sources are arranged to supply two different gas components having different thermal conductivities. Flow control elements 50a and 50b are provided to regulate flow of gas from each of sources

48a and 48b independently. The flow control elements are connected to signal outputs of a control system 52. The flow control elements are arranged so that they can be adjusted during operation in response to control signals applied by the control system 52. For example, flow control elements 48a and 48b may be conventional electrically-controllable valves or mass flow controllers provided in the connections between rotary connection 40 and sources 48a and 48b. However, any other element which can be used to regulate flow from a gas source in response to a control signal can be used.

The spindle is also provided with internal coolant passages 54 and 56 (FIG. 2) extending generally in the axial directions of the spindle within gas passageway 28. Internal coolant passages are connected via a further rotary connection 58 (FIG. 1) to a coolant source 60, so that a fluid coolant can be circulated by the source through the coolant passages and back to the coolant source. Coolant source 60 may include conventional devices for regulating the temperature and flow of the circulating coolant.

A heating element 70 is mounted within the chamber and surrounds spindle 20 below fitting 24. The chamber is also provided with an entry opening 72 leading to an antechamber 76, and a door 74 for closing and opening the entry opening. Door 74 is depicted only schematically in FIG. 1. and is shown as movable between the closed position shown in solid lines, in which the door isolates the interior of chamber 10 from antechamber 76, and an open position shown in broken lines at 74'. The door 74 is equipped with an appropriate control and actuation mechanism for moving it between the open position and closed positions. In practice, the door may include a shutter movable in the upward and downward directions as disclosed, for example, in U.S. Pat. No. 7,276,124, the disclosure of which is hereby incorporated by reference herein. The apparatus further includes a loading mechanism (not shown) capable of moving a wafer carrier from the antechamber 76 into the chamber and engaging the wafer carrier with the spindle in the operative condition, and also capable of moving a wafer carrier off of the spindle and into the antechamber.

The apparatus also includes a plurality of wafer carriers 80. In the operating condition shown in FIG. 1, a first wafer carrier 80a is disposed inside chamber 10 in an operative position, whereas a second wafer carrier 80b is disposed within antechamber 76. Each wafer carrier 80 includes a body 82 which is substantially in the form of a circular disc having a central axis 84 (FIGS. 2 and 3). In the operative position shown in FIG. 2, the central axis 84 of the wafer carrier body is coincident with the axis 22 of the spindle. The body 82 may be formed as a single piece or as a composite of plural pieces. For example, as disclosed in U.S. Published Patent Application No. 20090155028, the disclosure of which is hereby incorporated by reference herein, the wafer carrier body may include a hub 86 defining a small region of the body surrounding the central axis 84 and a larger portion defining the remainder of the disc-like body. The body desirably is formed from materials which do not contaminate the process and which can withstand the temperatures encountered in the process. For example, the larger portion of the disc may be formed largely or entirely from materials such as graphite, silicon carbide, or other refractory materials. The body has a generally planar top surface 88 and a bottom surface 90 extending generally parallel to one another and generally perpendicular to the central axis 84 of the disc. The body also has a plurality of wafer-holding features adapted to hold a plurality of wafers.

As best seen in FIGS. 2, 3, and 4, each wafer-holding feature includes a generally circular pocket 92 extending downwardly into the body from the top surface 88. Each pocket has a floor surface 94 disposed below the surrounding portions of the top surface 88. Each pocket also has a peripheral wall surface 96 surrounding the floor surface and defining the periphery of the pocket. The peripheral wall surface 96 extends downwardly from the top surface 88 of the body to the floor surface. As best seen in FIG. 2, the peripheral wall surface may slope outwardly, away from the center of the pocket, over at least a portion of the periphery. In particular, those portions of the peripheral wall surface furthest from the central axis 84 of the wafer carrier desirably slope outwardly, away from the central axis 84 of the wafer carrier in the direction down toward the floor surface 94. Each pocket 90 is also provided with a plurality of spaced-apart supports 98 extending upwardly from the floor surface 94 and terminating above the floor surface but below the main top surface 88 of the wafer carrier body.

The wafer carrier also includes a fitting 100 at central axis 84. Fitting 100 is arranged to engage with the fitting 24 of the spindle. The fitting 100 includes a frustoconical recess 100 having a downwardly facing open end 102 (FIG. 2). The frustoconical recess is closed at its top end 104, and tapers in the upward direction. The frustoconical fitting 100 has an included angle slightly larger than the included angle of the male frustoconical fitting 24 of the spindle. In the operative condition shown, the frustoconical fitting 24 of the spindle is engaged within the fitting 100 of the wafer carrier and abuts the wafer carrier along a generally circular line of engagement. This arrangement provides a stable mounting for the wafer carrier, so that the wafer carrier is held firmly fixed in position, but can be disengaged by lifting the wafer carrier upwardly along axis 22. In the engaged position, the male fitting 24 of the spindle terminates below the top end 104 of the female fitting 100, so as to provide a space 106 between the top end of the spindle and the top end 104 of the fitting in the wafer carrier. The engagement between the fittings provides a substantially fluid-tight seal between the space 106 and the surrounding interior space within the chamber. It is not essential to provide an absolutely perfect seal at this line of engagement.

The structure of the wafer carrier defines a plurality of conduits 108 extending generally horizontally within the wafer carrier. Conduits 108 communicate with the interior of fitting 100 through openings 110 adjacent the top wall 104 of fitting 100. In the operative condition, with the fitting 24 engaged with the wafer carrier, openings 110 communicate with the space 106 defined between the top end of the spindle and the top of the fitting 100. Conduits 108 also communicate with pockets 90 through inlet ports 112. As best seen in FIGS. 2 and 4, each pocket 92 has an inlet port 112 opening through the floor surface 94 of the pocket adjacent the center of the pocket, and preferably at the center of the pocket. The pattern of conduits 108 depicted in FIG. 3 is merely schematic. In practice, the conduits may be routed so that a conduit extending to one pocket does not run beneath another pocket. Also, the conduits may be branched. It is not necessary to provide an individual opening 110 at the fitting for every pocket. Conduits connected to multiple pockets may be connected to a single port 110.

The apparatus further includes a temperature monitoring apparatus 120 arranged to monitor the surface temperatures of wafers being treated during the process and to provide signals representing the distribution of surface temperatures across the wafers during the process. The temperature monitoring apparatus may include pyrometers 122 mounted to the chamber or, as shown, to the gas distribution element 12. In the particular embodiment depicted, the temperature monitoring apparatus includes two pyrometers 122a and 122b. Pyrometer 122a is arranged to monitor the temperature distribution across the surfaces of wafers contained in pockets disposed adjacent the periphery of disc-like carrier body 82, whereas pyrometer 122b is arranged to monitor the surface temperature distribution of wafers contained in inner pockets 92 disposed adjacent central axis 84. The pyrometers themselves may be conventional instruments of the type as, for example, those sold under the trademark REALTEMP™ by the Veeco Instrument Corporation of Plainview, N.Y. The pyrometers desirably are arranged to correct for the emissivity of the surfaces being monitored. For example, each pyrometer may be arranged to deliver a first signal representing the radiation emitted from a point being monitored and a second signal representing the emissivity of that point. The signals from the pyrometers are routed to control system 52. As further explained below, control system 52 is arranged to derive a signal representing the differences in temperatures between the peripheries of the wafers contained in the pockets and the centers of the wafers. Such a signal may be an aggregate signal representing the average difference over all of the various wafers contained in all of the pockets. The control system is further arranged to derive an error signal representing the deviation of the aggregate temperature difference signal from a desired value, and to control the flow control elements 50a and 50b responsive to that error signal, as also further explained below.

In operation, a wafer 124, such as a disc-like wafer formed from sapphire, silicon carbide, or other crystalline substrate, is disposed within each pocket 90 of each wafer carrier. Typically, the wafer has a thickness which is small in comparison to the dimensions of its major surfaces. For example, a circular wafer about 2 inches (50 mm) in diameter may be about 430 μm thick or less. As best seen in FIG. 2, the wafer is disposed with a top surface 126 facing upwardly, so that the top surface is exposed at the top of the wafer carrier. The opposite, bottom surface 128 of the wafer rests on supports 98 at the periphery of the wafer. The supports engage only a small portion of the bottom surface. The remainder of the bottom surface directly confronts the floor surface 94 of the pocket, but is elevated above the floor surface so that there is a gap 130 between the bottom surface 128 of the wafer and the floor surface 94 of the pocket. As used in this disclosure with reference to two surfaces, the term "directly confronts" means that for at least a portion of one of the surfaces referred to, there is no solid object intervening between the surfaces referred to. Stated another way, a line perpendicular to one surface passes from that surface to the other surface without passing through any solid object. For example, a line 132 remote from the supports 98 perpendicular to the bottom surface 128 of the wafer 124 extends to the floor surface 94 without passing through any solid object. The gap 130 communicates with the exterior of the wafer carrier, and thus with the atmosphere within chamber 10, through a small space 131 between the edge of the wafer and the peripheral wall 96 of the pocket.

In operation, in a process according to an embodiment of the invention, a wafer carrier 80 with wafers loaded thereon is loaded from antechamber 76 into chamber 10 and placed in the operative position shown in FIGS. 1 and 2. In this condition, the top surfaces of the wafers face upwardly, towards the gas inlet structure 12. Heater 70 is actuated, and the rotary drive 26 operates to turn spindle 20 and hence wafer carrier 80 around axis 22. Typically, the spindle is rotated at a rotational speed from about 50-1500 revolutions per minute. Process gas supply units 14a, 14b, and 14c are actuated to supply gases through the gas inlet element 12. The gases pass downwardly toward the wafer carrier, over the top surface 88 of the wafer carrier and the top surfaces 126 of the wafers, and downwardly around the periphery of the wafer carrier to the outlet and to exhaust system 18. Thus, the top surface of the wafer carrier and the top surfaces of the wafer are exposed to a process gas including a mixture of the various gases supplied by the various process gas supply units. Most typically, the process gas at the top surface is predominantly composed of the carrier gas supplied by carrier gas supply unit 14b. In a typical chemical vapor deposition process, the carrier gas may be nitrogen, and hence the process gas at the top surface of the wafer carrier is predominantly composed of nitrogen with some amount of the reactive gas components.

The fill gas supply unit 48a supplies a first fill gas, whereas the second fill gas supply unit 48b supplies a different fill gas. The fill gases are selected so that at least one of the fill gases has a thermal conductivity different from the process gas, and so that the two different fill gases have differing thermal conductivities. Preferably, the fill gases are selected so that they do not interfere with the desired reaction. In a typical chemical vapor deposition reaction, the first fill gas supplied by fill gas supply unit 48a may be hydrogen, helium or a mixture thereof, whereas the second fill gas supplied by unit 48b may be nitrogen. Hydrogen and helium have substantially higher thermal conductivity than nitrogen.

The fill gases pass through flow control elements 50a and 50b and mix with one another as they pass to rotary connection 40, into port 38 (FIG. 2), and upwardly through gas passageway 28 to outlet 30. The mixed fill gases thus pass into the space 106 defined by the mating fittings 24 and 100 and pass through ports 110, conduits 108, and ports 112 into the gaps 130 between the wafer bottom surfaces 128 and the floor surfaces 94 of the pockets. Some of the fill gas will leak out around the peripheries of the wafers. Also, some of the fill gas may leak from space 106 through small leaks between the mating fittings 24 and 100. However, any fill gas leaking through the mating fittings will pass downwardly below the bottom surface 90 of the wafer carrier, and hence will be taken out of the system by the exhaust system 18, without materially affecting the process. The gaps 130 between the wafer bottom surfaces and the floor surfaces will be filled with a gas which includes the fill gas, and which may also include some of the process gas.

Because the fill gas mixture passing into the wafer carrier includes some of the first fill gas, this fill gas mixture differs from the process gas with respect to thermal conductivity. Where the first fill gas includes a gas having a substantially higher thermal conductivity than the carrier gas incorporated in the process gas, the fill gas mixture typically will have a thermal conductivity higher than the thermal conductivity of the process gas. The flow rate of the fill gas is low enough that the fill gas in the gaps 130 does not lift the wafers off of the supports 98. Stated another way, the in-flow of fill gas tends raise the gas pressure within gaps 130. However, the spaces 131 around the edges of the wafers allow leakage of fill gas out of the pockets. Therefore, the pressure within the pockets does not rise to the point where the pressure elevates the wafers off of the supports. Merely by way of example, for a system processing wafers of 4-inch (100 mm) diameter, with pockets slightly larger than 100 mm in diameter, the total flow rate of the fill gas into each pocket typically is less than about 100 standard cubic centimeters per minute.

Heaters 70 transfer heat to the bottom surface 90 of the wafer carrier, principally by radiant heat transfer. The heat applied to the bottom surface of the wafer carrier flows upwardly through the body 82 of the wafer carrier to the top surface 88 of the wafer carrier. Heat passing upwardly through the body also passes upwardly through the gaps 130 to the bottom surface 128 of each wafer, and upwardly through the wafer to the top surface 126 of the wafer. Heat is radiated from the top surface 88 of the wafer carrier and from the top surfaces 126 of the wafer to the colder elements of the process chamber as, for example, to the walls of the process chamber and to the gas inlet element 12. Heat is also transferred from the top surface 88 of the wafer carrier and the top surfaces 126 of the wafers to the process gas passing over these surfaces. The temperature at the top surfaces 126 of the wafers represents a balance between the heat transfer through the solid body 82 of the wafer carrier and the gap 130 and the heat transfer from the top surface of the wafer. The thermal conductivity of the gas in the gap 130 is less than the thermal conductivity of the solid material constituting body 82. Therefore, where the wafer carrier top surface 88 has emissivity equal to or less than emissivity of the wafer top surface, the temperature of each wafer top surface 126 will tend to reach a value lower than the temperature of the surrounding top surface 88 of the wafer carrier. Regions of the carrier adjacent the edges of the wafer will be heated by the surrounding, hotter portions of the wafer carrier. This tends to yield a non-uniform surface temperature distribution, with the edge regions of the wafer hotter than the central regions. Conversely, where the wafer carrier top surface has a substantially larger emissivity than the emissivity of the wafer surfaces, the top surface of the wafer carrier may be cooler than the top surface of the wafer, which tends to cause the opposite effect.

Differences in the height h of the gap across the extent of the wafer can cause differences in heat transfer. For example, as shown in FIG. 5, a wafer which is bowed upwardly at its center provides a gap 130 having a height $h_c$ at the center of the wafer greater than the height of the gap $h_e$ at the edge of the wafer. The increases the thermal resistance of the gap at the center, so that the rate of heat transfer per unit area to the bottom surface 128 of the wafer will be lower at the center than at the edge. This tends to make the temperature of the wafer top surface 126 at the center lower than the temperature at the edge. The opposite effect occurs when the wafers warp downwardly at the center, so that the height $h_c$ at the center of the gap is less than the height $h_e$ at the edge of the gap. Also, non-planarity of the floor surfaces 94 of the pockets can cause similar effects.

Moreover, the pattern of non-uniformity tends to change during processing. For example, where the process involves chemical vapor deposition and epitaxial growth on the top surface of the substrate, the deposited material may have a normal, unconstrained lattice spacing, different from that of the wafer material. This tends to induce compressive or tensile deformation of the top surface, leading to warpage of the wafers. The emissivity of the wafer top surfaces also may change during the process.

The pyrometers 122a and 122b monitor emission from the wafer carrier and wafers during the process. As rotation of the wafer carrier about axis 22 brings successive portions of the wafer carrier top surface and wafer top surfaces into alignment with each pyrometer, the signal from that pyrometer will vary. A typical pattern of variation in a signal representing emissions from the surfaces as monitored by a pyrometer is shown in FIG. 6. In this pattern, the top surface 88 of the wafer carrier has a substantially higher emissivity than the top surfaces 126 of the wafer, such difference in emissivity being greater than any difference in temperature between the wafer carrier and the wafer. Therefore, the signal $S_{88}$ representing radiation emitted by the surface provided when a part of the wafer carrier surface 88 is aligned with the pyrometer has a greater magnitude than the corresponding signal $S_{126}$ provided when the wafer top surface 126 is aligned with the pyrometer. The signal from the pyrometer thus includes a recurring pattern of step-wise changes in magnitude. By detecting these changes, the control system 52 can discriminate between those portions of the signal $S_{88}$ representing emissions from the wafer carrier top surface and those portions of the signal $S_{126}$ representing emissions from the wafer top surfaces. Merely by way of example, in one simple scheme, the control system may sample the signal at successive sampling intervals $I_s$ and take only those samples occurring after a step-wise reduction in the signal greater than a given magnitude and before a step-wise increase in the signal as representing the samples taken from an individual wafer, and thus representing emissions from the wafer top surface. The control system may then process the set of samples from an individual wafer to determine the pattern of temperature variation. The system may select one or more samples at the beginning of the set, one or more samples at the end of the set, or both as representing the emissions, of the edge regions of the wafer, and one or more samples at the middle of the set as representing the emissions from central portions of the wafer. These signals may be converted to temperatures of the wafer by applying the emissivity signals from the pyrometers in the conventional manner. The system may compute the difference $\Delta T$ between the center and edges of the wafer. The temperature difference will have a magnitude and will have a sign (positive or negative) indicating whether the center of the wafer is hotter or cooler than the edges. The temperature difference signals for the various wafers can be combined mathematically (as, for example, by calculating the mean or median of these signals) to yield an aggregate signal representing the average temperature difference over all of the wafers. This signal can be compared to a desired value (normally 0) of temperature difference so as to derive an error signal. In the particular example illustrated in FIG. 6, the centers of the wafers are cooler than the edges of the wafers, so that the difference $\Delta T$ is positive.

The control system responds to the aggregate error signal to vary the composition, flow, or both of the fill gas mixture and thereby vary the composition of the fill gas within the gaps 130 between the wafers and the floor surfaces of the pockets. For example, where the aggregate error signal is positive, indicating that the centers of the wafers are cooler than the edges, the control system may actuate flow controllers 50a and 50b to increase the proportion of a relatively high-conductivity fill gas from the first fill gas source 48 while maintaining the total flow rate of the fill gas mixture constant, thereby increasing the thermal conductivity of the mixed fill gas present in the pockets 92. This tends to increase the temperature of the central portion of the wafer top surface 126 relative to the peripheral portions of the wafer top surface. The mechanism of this effect can vary. At relatively low fill gas flow rates, there is a concentration gradient within each pocket 92. Near the edges of the wafer, diffusion of the process gas into the pocket causes some of the process gas to mix with the fill gas supplied to the pocket. Because the process gas has a different thermal conductivity, the resulting mixed gas at the edge regions of the pocket will have a different thermal conductivity than the substantially pure fill gas at the center of the pocket. For example, where the fill gas has a higher thermal conductivity than the process gas, the gas in the center region of the pocket will have a higher thermal conductivity than the gas at the edge regions of the pocket. By increasing the proportion of the higher conductivity gas component in the fill gas, this effect can be accentuated. The higher conductivity of the fill gas at the center of the pocket tends to increase the temperature of the wafer center relative to the temperature of the edge regions, and thus counteract the temperature difference. Where the pattern of temperature variation is opposite to that shown in FIG. 6, so that the center regions are hotter than the edge regions, the control system may take the opposite action to increase the proportion of a lower-conductivity fill gas component.

The control system may also vary the flow rate of the fill gas mixture. This effect may cause a change in the concentration gradient discussed above. At a higher flow rate, the increased flow of the fill gas mixture supplied through the central ports 112 counteracts the effect of diffusion of the process gas into the pockets to a greater degree and thereby reduces the concentration gradient. Conversely, a lower flow rate can increase the concentration gradient and thus increase the difference in thermal conductivity between the gas in the central regions of the pockets and the gas at the peripheral regions of the pockets. In other situations, an increased flow rate of the fill gas may affect the wafer surface temperature through other mechanisms. The flow gas passing through conduits 108 in the wafer carrier body tends to reach thermal equilibrium with the surrounding portions of the body. The temperature of the fill gas entering the pockets through the central ports 112 may be slightly higher than the temperature of other gas within the pockets 92. This effect may cause increased heat transfer to the center of the wafer, thereby raising the temperature in the central region of the wafer relative to the temperature at the edge region of the wafer. Changes in the composition of the fill gas may vary the specific heat of the fill gas and thus vary the effect of the fill gas on the temperature distribution.

The present invention is not limited by any theory of operation. For a wafer carrier of a given size and configuration and for wafers of a given size, the effect of variations in the fill gas composition, fill gas flow, or both are repeatable. A particular variation in the fill gas flow rate, fill gas composition, or both will repeatably tend to raise or lower the surface temperature at the center of the wafer relative to the surface tension at the edges of the wafers. Therefore, the effect of different variations can be determined by experiment, and the control system can be programmed accordingly. Thus, if the aggregate error signal indicates that the surface temperature at the centers of the wafer is greater than the surface temperatures at the peripheries of the wafer, the control system will vary the fill gas flow rate, composition, or both in a manner which has been determined by experiment to reduce the temperature at the center of the wafer. If the aggregate error signal indicates that the opposite correction is needed, the control system will command the flow control devices 50a and 50b to bring about a variation in fill gas flow rate, fill gas composition, or both, which has been determined by experiment to have the opposite effect.

The control system thus can act dynamically, so as to vary the fill gas flow rate, fill gas composition, or both with time during the process and effectively suppress undesired differences in surface temperature during the process. Because the wafers are relatively thin and have low thermal inertia, the response time of the system is relatively short compared to the time scale of the process, and compared to the time scale of undesired temperature variations.

The process continues until the desired treatment of the wafer has been completed. During the process, the control system 52 may continue to vary the fill gas flow rate, composition, or both, as discussed above, dynamically. Once the process has been completed, the wafer carrier 80 is removed from the spindle and replaced with a new wafer carrier.

The ability of the apparatus to provide the fill gas to the wafer-carrying regions of a removable wafer carrier provides a significant advantage. As discussed, for example, in U.S. Pat. No. 6,685,774, and in US Published Patent Application No. 20090155028, the disclosures of which are hereby incorporated by reference herein, the mating fittings on the wafer carrier and spindle provide for easy removability and seating, and also offer a secure connection. The removable wafer carriers can be used to transport wafers through successive processes. Wafers can be loaded and unloaded while the chamber remains in operation with another carrier. Further, the carriers can be cleaned readily. The flow gas connection, as discussed herein, preserves these advantages while also allowing effective connection of the flow gas to the removable wafer carrier.

Numerous various and combinations of the features discussed above can be employed. The wafer carrier may include more or fewer wafer-carrying regions than shown and discussed above. The configurations of the wafer-carrying regions can be varied. The control system may differentiate between signals representing emissions from the wafers and signals representing emissions from the wafer carrier in a manner different from that discussed above. For example, for the rotational position of the wafer carrier remains fixed relative to the spindle during the process. Therefore, the control system may be supplied with signals representing the rotational position of the spindle, and may use these signals to determine which samples of the emission signal from the pyrometer represent the edges of the wafer and which represent the centers of the wafer.

It is not essential to monitor the pattern of temperature variations during the process. For a given wafer treatment process using wafers of a given composition and thickness, and wafer carriers of a given configuration, the pattern of temperature non-uniformity which develops in the process absent corrective action will be repeatable. Therefore, a given pattern of variation in the fill gas flow rate, composition, or both with time will tend to suppress these undesired variations in surface temperature distribution. This pattern can be determined experimentally as, for example, by running a prototype process using equipment which performs monitoring as discussed above and recording the pattern of variations in the fill gas composition, flow rate, or both. This pattern can then be repeated by the control system without active monitoring of the pattern of temperature variations. In a further variant, a pattern of variation in the fill gas flow rate, composition or both with time can be selected by treating wafers using several different patterns, measuring the properties of these wafers, and selecting a pattern which gives the best properties. For example, one or more properties such as photoluminescence wavelength, sheet resistance of a semiconductor, surface morphology, or other properties correlated with surface temperature during the process can be measured at plural points on each wafer formed in a process using a first pattern. The pattern of fill gas composition and flow rate with time can be adjusted based on the variation in observed properties of the wafers. This procedure can be repeated until the desired results are achieved.

As described, for example, in co-pending, commonly assigned U.S. Provisional Patent Application Ser. No. 61/190, 494, and U.S. patent application Ser. No. 12/549,768, the disclosures of which are hereby incorporated by reference herein, the bottom surfaces of the pockets may have surfaces which are not planar. For example, the bottom surfaces of the pockets may be slightly higher at the center to provide smaller gaps at the centers of the wafer than at the edges when the wafers are flat. As also described in the '494 Application, the bottom surface of the wafer carrier may have non-planar features so as to provide differences in thermal resistance of the wafer carrier body in the region carrying each pocket. In still other variations, the wafer carrier body may be formed from plural pieces to provide interfaces with higher thermal resistance than the surrounding material of the carrier body. Such arrangements are described, for example, US Published Patent Application No. 20070186853, the disclosure of which is also incorporated by reference herein.

In a further variant, the fill gas delivery features of the spindle, the wafer carriers, or both may be varied so as to provide different flows of fill gas to different wafer holding regions of the wafer carrier. As shown in FIG. 7, for example, the fitting 200 of each wafer carrier may be a generally frustoconical fitting similar to the filling 100 discussed above. The wafer carrier may include a first set of conduits 208 connected to a first set of ports near the top of the fitting. These conduits may be connected to a first set of wafer holding regions such as a first set of pockets near the central axis of the wafer carrier. The wafer carrier may also include a second set of conduits 209 connected to a second set of ports 211 opening into the fitting at a location spaced axially from the first set of ports as, for example, at a location further from the top surface 204 of the fitting. Conduits 209 desirably are connected to a second set of wafer-holding regions as, for example, a set of pockets near the periphery of the wafer carrier. The spindle 220 may include a generally frustoconical male fitting 224 similar to the fitting 24 discussed above with reference to FIG. 2. Fitting 224 may have a groove 225 extending circumferentially around the central axis 222 of the spindle. This spindle may include a second gas passageway 229 having an outlet port 231 communicating with the groove 225. The first and second gas passageways 228 and 229 are connected through separate rotary connections (not shown) to separate sets of fill gas control elements. When fittings 200 and 224 are engaged with one another, with the wafer carrier in an operative condition on the spindle, the first set of ports 210 and the first set of conduits are in communication with the space between the top end of the fitting 224 and the top surface of the fitting 100, and thus in communication with the first fill gas passageway. Conduits 209 are in communication with the recess or groove 225 in the fitting, and thus in communication with the second fill gas passageway 229. Thus, the fill gas supplied to the different sets of wafer-holding regions can be adjusted independently.

In further variants, more than two zones can be provided. Releasable fittings other than the frustoconical fittings discussed above can be used. For example, different fittings such as those shown in the aforementioned U.S. Pat. No. 6,685,774, and US Published Patent Application No. 20090155028 can be used.

The invention can be applied in various wafer treatment processes as, for example, chemical vapor deposition, chemical etching of wafers, and the like.

As these and other variations and combinations of the features discussed above can be employed, the foregoing description of the preferred embodiments should be taken by way of illustration rather than by limitation of the invention as defined by the claims.

The invention claimed is:

1. A wafer processing apparatus comprising:
   (a) a processing chamber;
   (b) a wafer carrier including:
   a body defining a central axis and a top surface transverse to the central axis, the body further having a plurality of pockets in the top surface of the body adapted to hold a plurality of wafers so that top surfaces of the wafers are exposed and so that there is a gap between a bottom surface of each wafer and a floor surface of the respective pocket, each floor surface being recessed below the top surface of the body;
   the body including a plurality of gas conduits extending to the plurality of pockets so that a fill gas supplied to the plurality of gas conduits will be directed into the gaps between the bottom surface of the wafers and the floor surface, wherein each floor surface has a port disposed at the center of the respective pocket, and the plurality of gas conduits communicate with the plurality of pockets through respective ports, and each pocket is only in fluid communication with the port of the respective pocket and the top surface of the body of the wafer carrier; and
   a fitting disposed at the central axis of the body, the fitting being adapted to releasably engage an upper end of a spindle of the wafer processing apparatus and hold the wafer carrier on the spindle so that the plurality of gas conduits extend to and are in fluid communication with a space formed between the fitting and the upper end of the spindle, wherein the spindle is mounted in the processing chamber for rotating the body about an axis extending in upward and downward directions.

2. The apparatus as claimed in claim 1 further comprising:
   (c) the spindle having one or more gas passageways having one or more openings adjacent the upper end of the spindle, the upper end of the spindle being adapted to releasably engage the wafer carrier so that the wafer carrier is mechanically connected to the spindle and so that the plurality of gas conduits of the wafer carrier are in fluid communication with the one or more openings of the gas passageways; and
   (d) a rotary connection having an inlet communicating with the one or more gas passageways of the spindle.

3. The apparatus as claimed in claim 2 further comprising:
   (e) a motor drive for rotating the spindle about the axis.

4. The apparatus as claimed in claim 3 further comprising:
   (f) a gas inlet element mounted to the chamber adjacent an upper end of the chamber, the gas inlet element being constructed and arranged to direct process gasses downwardly toward the spindle and toward the wafer carrier mounted on the spindle; and
   (g) a heater disposed within the chamber for heating the wafer carrier carried mounted on the spindle.

5. The apparatus as claimed in claim 4 wherein the heater is disposed below the wafer carrier and is arranged to heat the bottom surface of the wafer carrier.

6. The apparatus as claimed in claim 2 wherein the upper end of the spindle includes a tapered section having upper and lower end and the one or more openings of the one or more gas passageways are disposed above the lower end of the tapered section.

7. The apparatus as claimed in claim 2 further comprising
   (e) a control system having a flow controller that is adapted to control the thermal conductivity of a gas disposed in the gaps between the wafers and the body by controlling at least one of a flow rate or composition of a fill gas through the gas conduits of the wafer carrier.

8. The apparatus as claimed in claim 7 wherein the control system is adapted to control the flow rate of the fill gas so that the gas disposed in the gaps between the wafers and the body includes a mixture of the fill gas and process gasses within at least some portions of the gaps.

9. The apparatus as claimed in claim 8 wherein the control system is adapted to control the thermal conductivity of the gas disposed in the gaps between the wafers and the body such that the gas at edge regions of each pocket has a different thermal conductivity than the gas at the center of the pocket.

10. The apparatus as claimed in claim 9 wherein the control system is adapted to control the thermal conductivity of the gas disposed in the gaps between the wafers and the body to counteract the effects of warpage of the wafers held by the wafer carrier.

11. The apparatus as claimed in claim 7 wherein each pocket has a plurality of spaced-apart supports extending upwardly from the surface of the body and adapted to hold a corresponding one of the wafers, and the control system is adapted to control the flow rate of the fill gas so that the wafers do not lift off of the supports.

12. The apparatus as claimed in claim 7 further comprising (f) a temperature monitoring apparatus arranged to record surface temperatures of the wafers, wherein the control system is adapted to control at least one of the flow rate or composition of the fill gas in response to temperatures recorded by the temperature monitoring apparatus.

13. The apparatus as claimed in claim 1 wherein the fitting defines a recess open in the downward direction for receiving the spindle and the one or more gas conduits communicate with the recess.

14. The apparatus as claimed in claim 13 wherein the recess is tapered in the upward direction.

15. The apparatus as claimed in claim 1 wherein each pocket includes a peripheral wall extending upwardly from the floor surface to the top surface and a plurality of supports extending above the floor surface but below the top surface for supporting a wafer above the floor surface.

16. A wafer processing apparatus comprising:
(a) a processing chamber;
(b) a wafer carrier including:
a body defining a central axis and a top surface transverse to the central axis, the body further having wafer-holding features adapted to hold a plurality of wafers so that top surfaces of the wafers are exposed and so that there is a gap between a bottom surface of each wafer and a surface of the body;
the body including a plurality of gas conduits extending to the wafer-holding features of the body so that a fill gas supplied to the plurality of gas conduits will be directed into the gaps between the bottom surface of the wafers and the body; and
a fitting at the central axis of the body, the fitting being adapted to releasably engage an upper end of a spindle of the wafer processing apparatus and hold the wafer carrier on the spindle so that the plurality of gas conduits extend to and are in fluid communication with a space formed between the fitting and the upper end of the spindle, wherein the spindle is mounted in the processing chamber for rotating the body about an axis extending in upward and downward directions, and
wherein the wafer-holding features include a plurality of pockets in the top surface of the body, and wherein the conduits communicate with the pockets,
wherein each pocket includes a floor surface recessed below the top surface, a peripheral wall extending upwardly from the floor surface to the top surface and a plurality of supports extending above the floor surface but below the top surface for supporting a wafer above the floor surface, and
wherein each floor surface has a port disposed adjacent the center of the pocket or at the center of the pocket, and the conduits communicate with the pockets through the ports, and each pocket is only in fluid communication with the port of the respective pocket and the top surface of the body of the wafer carrier.

\* \* \* \* \*